(12) United States Patent
Song et al.

(10) Patent No.: US 11,150,707 B2
(45) Date of Patent: Oct. 19, 2021

(54) GRAPHIC PROCESSING UNIT AND HOST CASING HARDWARE CONFIGURATION

(71) Applicants: Inventec (Pudong) Technology Corporation, Shanghai (CN); INVENTEC CORPORATION, Taipei (TW)

(72) Inventors: Er-Zhen Song, Shanghai (CN); Yuehong Jin, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/810,964

(22) Filed: Mar. 6, 2020

(65) Prior Publication Data

US 2021/0209718 A1 Jul. 8, 2021

(30) Foreign Application Priority Data

Jan. 3, 2020 (CN) .......................... 202010006921.4

(51) Int. Cl.
| | | |
|---|---|---|
| *G06F 1/20* | (2006.01) | |
| *H05K 5/02* | (2006.01) | |
| *H05K 7/20* | (2006.01) | |
| *H05K 5/00* | (2006.01) | |
| *H05K 7/14* | (2006.01) | |
| *H05K 1/14* | (2006.01) | |

(52) U.S. Cl.
CPC ................. *G06F 1/20* (2013.01); *H05K 1/14* (2013.01); *H05K 5/0026* (2013.01); *H05K 5/0217* (2013.01); *H05K 7/14* (2013.01); *H05K 7/20136* (2013.01); *H05K 7/20772* (2013.01)

(58) Field of Classification Search
CPC ........... G06T 1/20; G06F 1/20; H05K 5/0026; H05K 5/0217; H05K 7/20136
See application file for complete search history.

(56) References Cited

U.S. PATENT DOCUMENTS

| 9,795,055 B1* | 10/2017 | Campbell | .......... H05K 7/20145 |
|---|---|---|---|
| 2008/0037209 A1* | 2/2008 | Niazi | ....................... G06F 1/181 |
| | | | 361/727 |
| 2008/0137284 A1* | 6/2008 | Flynn | ....................... G06F 1/183 |
| | | | 361/679.32 |
| 2020/0229311 A1* | 7/2020 | Wu | ....................... H05K 7/1405 |

\* cited by examiner

*Primary Examiner* — Mukundbhai G Patel
(74) *Attorney, Agent, or Firm* — Locke Lord LLP; Tim Tingkang Xia, Esq.

(57) ABSTRACT

The disclosure relates to computer technical field, and provides a GPU with specific shape of casing and a host casing hardware configuration. Body of the casing of the GPU includes a rectangle and a notch, the notch is located on a corner of the rectangle and is in a right trapezoid shape. In the host casing hardware configuration, the 2U host casing is divided into front area and rear area; hard disk assembly and fan assembly are disposed on the front area; the rear area is divided into top area and bottom area; 4 GPUs and a GPU tray are disposed on the top area in a staggered relationship, and motherboard and CUP and motherboard connector disposed on the motherboard are disposed on bottom area. The disclosure provides an advantage of improving the arrangement density of the components in the host casing.

6 Claims, 6 Drawing Sheets

GRAPHIC PROCESSING UNIT AND HOST CASING HARDWARE CONFIGURATION

CROSS-REFERENCE TO RELATED APPLICATIONS

This non-provisional application claims priority under 35 U.S.C. § 119(a) on Patent Application No(s). 202010006921.4 filed in China on, Jan. 3, 2020, the entire contents of which are hereby incorporated by reference.

BACKGROUND OF THE INVENTION

Technical Field of the Invention

The invention relates to the field of computer technology, more particularly to a graphic processing unit (GPU) and a host casing hardware configuration.

Description of the Related Art

Graphics processing unit (GPU) is an advance version of graphic processing card. The graphic processing card generally only provides buffer and transfer for graphic data but does not process the graphic. The GPU has independent processing unit to compute the graphic data.

In recent years, artificial intelligence (AI) has been successful in various fields, such as image recognition, natural language processing, and recommendation system, which provides infinite possibilities for commercial field. An AI module needs massive amounts of training data to ensure a high degree of accuracy to exert significant and effective power in actual implementation. Besides the algorithm, the breakthrough of the AI technology relies on the rapid development of the computation ability, where the computation ability is mainly achieved by the speed-up technique of GPU. This technique plays a critical role in this aspect and can share the workload of dense application computation and make the CPU run the rest codes to achieve remarkable application performance. With respect to the user, the application's operating speed is significantly accelerated GPU server can provide GPU-based application to various fast, stable, and flexible scene computation services, such as video encoding and decoding, deep learning, and scientific computation. The graphics processing unit is the "heart" of the GPU server and is particularly designed for performing complicated mathematic and geometric computations, where these computations are necessary for image rendering. And some of the fastest GPU even have a number of transistors more than a regular CPU.

To satisfy the requirements of some specific applications, such as 3D panoramic service, a server often contains two GPUs, a typical GPU graphic processing card is an expansion card in a form of "full-length, full-height, and double-width" and with PCIe socket thereon, and the electrical connection is implemented by the PCIe connector on a mainboard or cables.

Most of the conventional GPU server uses 2U host casing. Considering the width of the host casing and the size of the full-sized GPU, it at most can accommodate three CPUs in widthwise. And considering that each GPU host casing contains its own power supply, the internal space of the host casing becomes much limited so that the host casing usually can only accommodate two GPUs, which largely limits the processing ability of the GPU server, and such an arrangement is unable to meet the quantity of GPU required by AI technology.

SUMMARY OF THE INVENTION

The object of the invention is to provide a GPU whose casing is in a specific shape allowing two GPUs to be arranged in a staggered relationship to reduce the overall width of the GPU array.

Another object of the invention is to densely arrange the said GPU whose casing is in a specific shape in host casing so as to densely arrange at least four GPUs, two CPUs, six fans and ten something hard disks by dividing space of the 2U host casing in a suitable manner.

The invention provides a GPU having components and wiring being integrated on an outer casing. A body of the outer casing comprises a rectangle having a notch, and the notch is located at a corner of the rectangle and is in a trapezoid shape with a right angle.

In the abovementioned GPU, a rear support is disposed on an end of the outer casing having the notch, a front support is disposed on another end of the outer casing; the rear support has a through hole, and an engagement component is disposed on the front support.

In the abovementioned GPU, a protrusion mating the notch is located on a longitudinal side of the outer casing; and a plurality of GPU connectors are disposed on a side surface of the protrusion and are configured to introduce signal.

The disclosure further provides a host casing hardware configuration. The 2U host casing is divided into a front area and a rear area, a hard disk assembly and a fan assembly are disposed in the front area; the rear area is further divided into a top area and a bottom area; four GPUs according to any one of claim 2 and claim 3 and a GPU tray are disposed on the top area and are arranged in an alternate arrangement, a motherboard and a CPU and a motherboard connector disposed on the motherboard are disposed in the bottom area.

In the abovementioned host casing hardware configuration, a hard disk back panel is disposed on a side of the hard disk assembly near the fan assembly, two ends of the hard disk back panel are fixed and connected to two side walls of the 2U host casing to provide signal connection to the hard disk assembly.

In the abovementioned host casing hardware configuration, a temperature sensor is disposed between the hard disk assembly and the hard disk back panel for sensing a temperature of an air inlet of the fan assembly.

In the abovementioned host casing hardware configuration, a front top cover is disposed outside the hard disk assembly, a rear top cover is disposed on other part, and the front top cover and the rear top cover are partially overlapped to prevent dust or foreign materials from falling into the 2U host casing.

In the abovementioned host casing hardware configuration, a lateral beam is disposed at an air outlet side of the fan assembly, two ends of the lateral beam are fixed and connected to two side walls of the 2U and have a plurality of engagement holes and a plurality of screw holes thereon.

In the abovementioned host casing hardware configuration, an end of the GPU tray is fixed to a middle part of the lateral beam; the front supports of a third GPU and a fourth GPU of the four GPUs are respectively fixed to two ends of the lateral beam.

In the abovementioned host casing hardware configuration, the rear supports of a first GPU and a second GPU of the four GPUs are fixed to another end of the GPU tray.

In the abovementioned host casing hardware configuration, the front supports of the first GPU and second GPU are fixed to the rear board of the 2U host casing; and the rear supports of the third GPU and fourth GPU are directly fixed to the motherboard via a screw.

Comparing to the related art, the GPU disclosed by the technical idea of the invention has a casing in a unique shape by forming a trapezoidal notch on a typical rectangular casing, and such a unique shape of casing allows the adjacent GPUs to partially fit each other so that they can be arranged side by side in a way having a reduced overall width; that is, the overall width of the arrangement of each pair of GPUs is smaller than the sum of the width of two GPUs, where their difference is the width of one notch. In such a case, the widthwise direction is enough to accommodate four GPUs, achieving a high-density arrangement of GPU in a limited space of host casing as possible.

On the other hand, in order to spare sufficient widthwise space for GPUs, the utilization of the internal space of the host casing should be well planned. Firstly, the hard disk assembly and the fan assembly that are larger in height are arranged near the host casing panel, such that the rear space is available for the GPUs, the CPUs, and some connectors. And a GPU tray is disposed in the rear space, where the GPU tray can divide the rear space into a top area and a bottom area. Taking advantage of the feature that all of the GPUs, CPUs, and connectors have a smaller size in one dimension, the GPUs and CPUs are respectively placed flat on the top area and bottom area, such that the top and bottom areas both have gaps for air to flow through. Therefore, although the height of the fan assembly is measured 2U, its air outlet facing the GPUs and CPUs still ensures that airflow can take the heat generated by the GPUs and CPUs away during operation.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
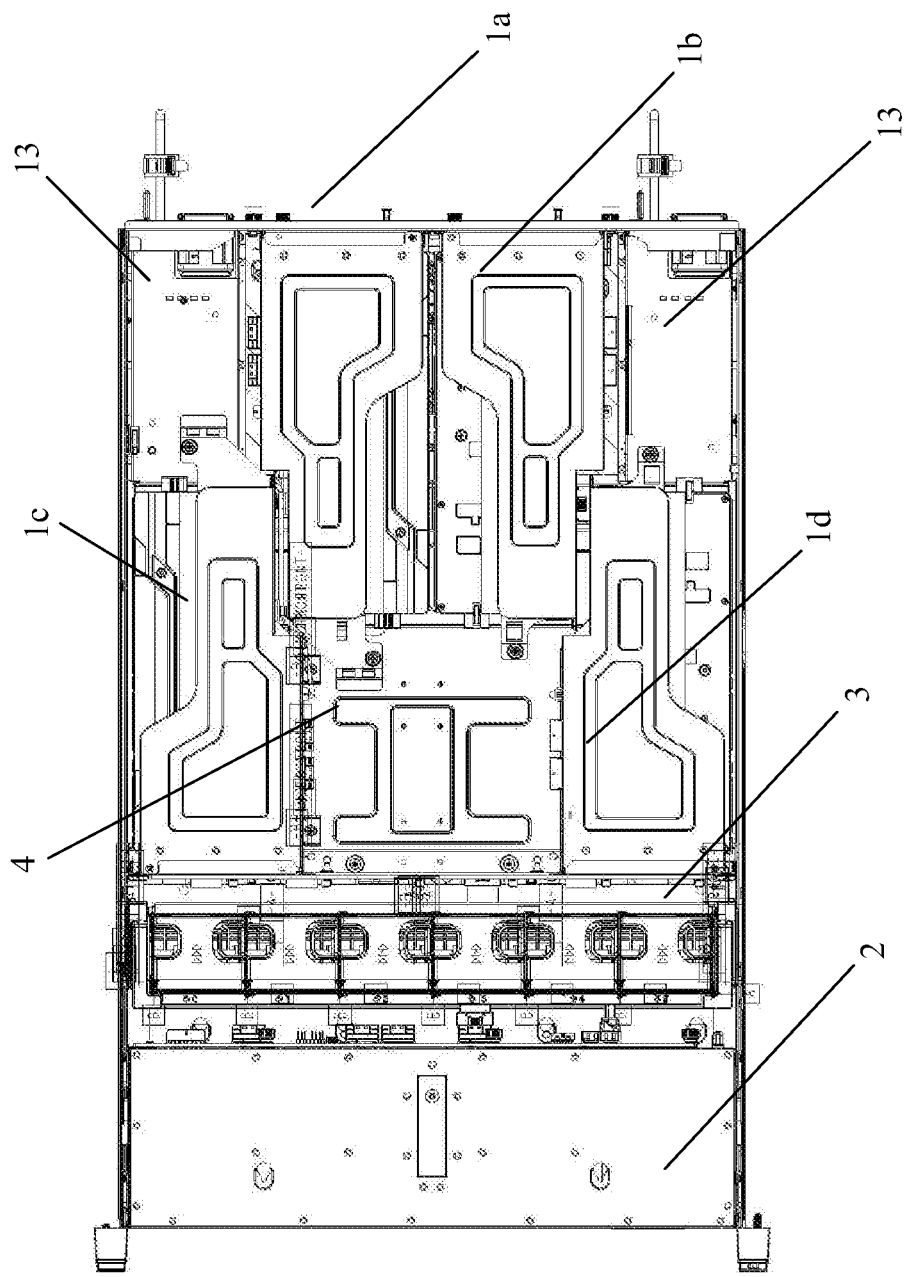
FIG. 1 is a top view of the interior of a host casing of one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In order to make the purposes and features of the invention apparent, embodiments of the invention are further described together with the appending drawings. However, the invention may be implemented in different manners, and not limited to the following embodiments. Also, embodiments and features of the embodiments are allowed to be combined if there are no confliction therebetween. Upon following illustration, advantages and features of the invention will be more clear.

It is explained that the appending drawings are simplified, the ratio of the appending drawings are not accurate, and the appending drawing are only configured for illustrating purposes of the embodiments of the invention in a convenient and clear manner.

It is claimed that, reference numbers of the steps in this invention are only for the purpose of citation and not intended to limit the order. For the steps whose order is required to be highlighted, such order will be explained by specific words.

With the development of the AI technology, the computations related to the neural network deep learning becomes more and more complex, such that the computational load for the Graphics Processing Unit (GPU) is further increased. Although the regular arrangement had become duo-GPU, it is still unable to satisfy the computational requirements of the image data required by the AI technology. Therefore, adding the quantity of GPUs is a necessity, however, the conventional 2U host casings do not have sufficient internal space and only can accommodate three GPUs at most. To increase the amount of GPUs, the common solution is to apply more host casings, but which is accompanied by additional components, such as power supply, fan, connector, riser card, and support, increasing the cost and installation time.

Figure 6:
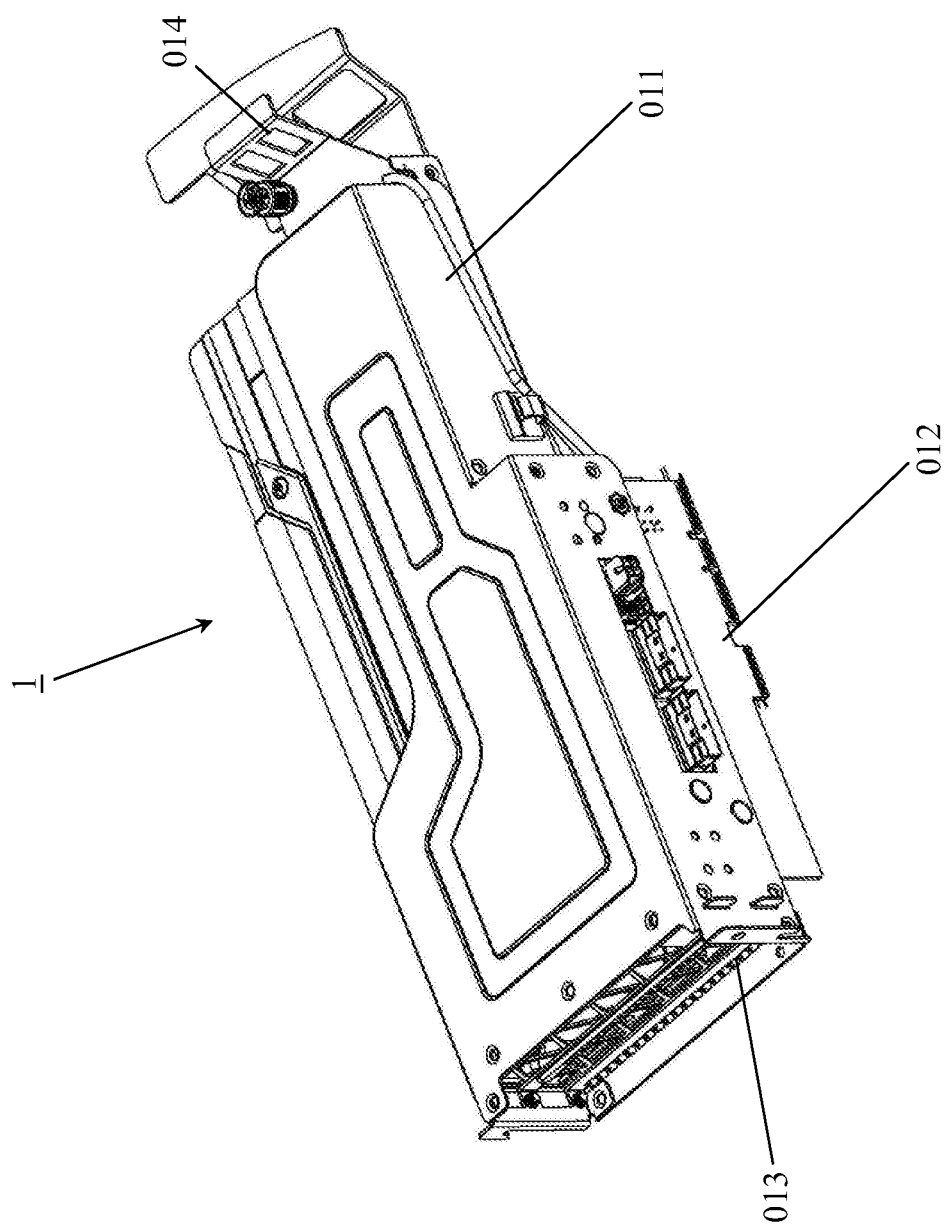
FIG. 6 is a perspective view of a GPU of the invention.

In order to arrange more GPUs into a single 2U host casing, as shown in FIG. 6, the invention provides a GPU 1 that is in a specific shape. This GPU integrates the associated components and cables on/into the casing. The shape of the said casing is basically a rectangle but has a recess/notch portion 011. Specifically, as shown in FIG. 6, the notch 011 is in a trapezoidal shape with a right angle and located at a corner of the rectangle. There is a protrusion 012 disposed with a plurality of connectors, where the connectors are permanently connected to power supply and electrical signal or the like. A rear support 014 is disposed on one end of the GPU 1 near the notch 011, and there is a through hole formed on the rear support 014. When the GPU is required to be firmly fixed in place, the GPU can be further fixed to a supporting structure via a screw being disposed through the through hole. A front support 013 is disposed on one end of the GPU 1 near the protrusion 012, and there is an engagement structure formed on the front support 013, where the engagement structure can be engaged with a mating engagement hole in the host casing, achieving a tool-less installation and improving the installation efficiency.

Two of the GPUs 1 can abut each other and be arranged in an alternate arrangement by tightly matching their notches 011. The pair of the GPUs has an overall width smaller than that of two conventional rectangle casings by the width of one notch 011. In an actual embodiment, two of the GPUs 1 in the alternate arrangement can be arranged in a pair, and a standard host casing of 2U can accommodate two pairs of the GPUs 1 (four GPUs 1).

Please refer to FIG. 1 to FIG. 5, the invention further provides a host casing hardware configuration based on the GPU 1 in the shape shown in FIG. 6.

In a specific embodiment, the host casing is a standard 2U host casing.

Figure 2:
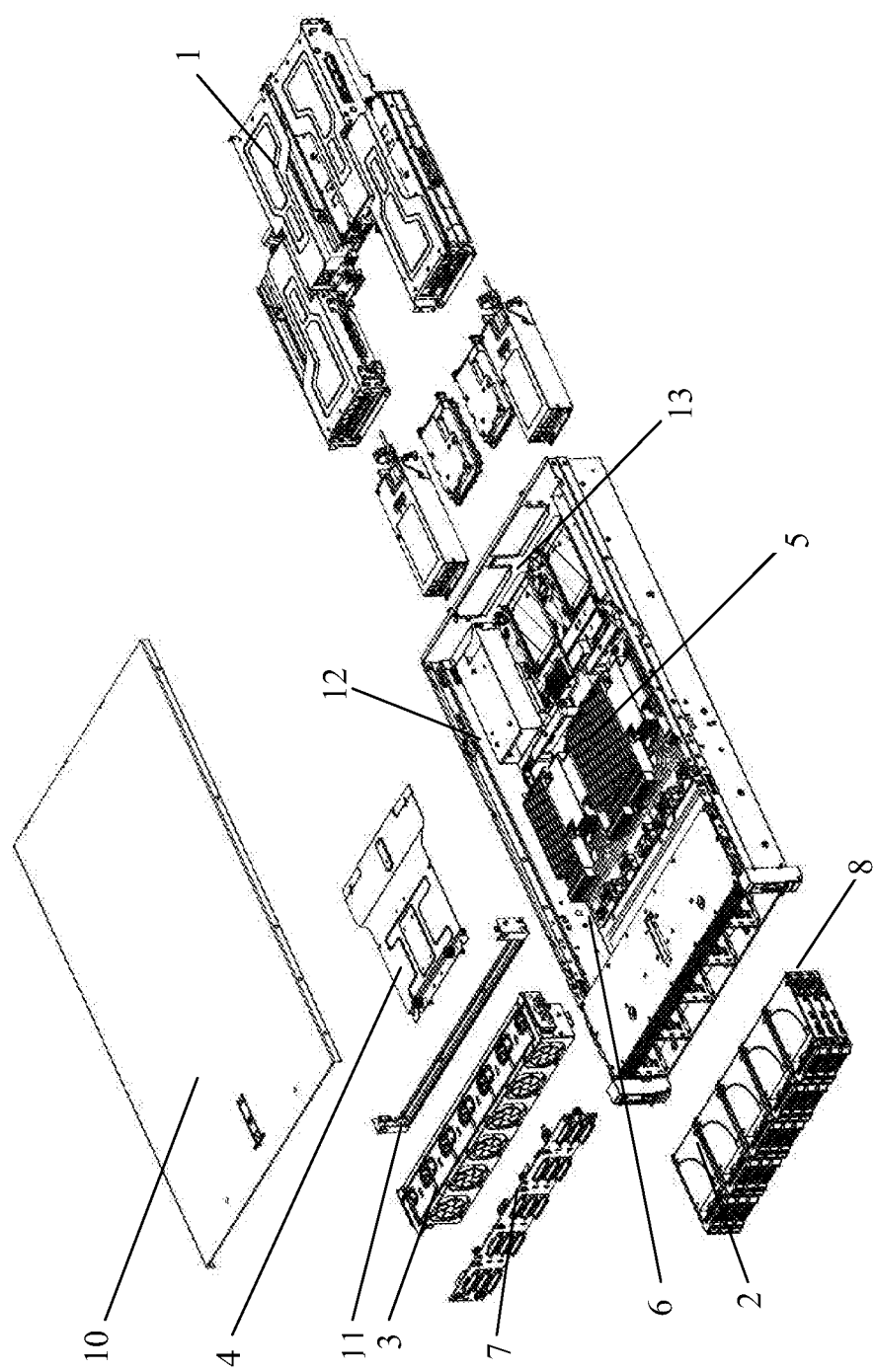
FIG. 2 is an exploded view of FIG. 1.

As the exploded view shown in FIG. 2, defining that the standard 2U host casing has a front area and a rear area, and a hard disk assembly 2 and a fan assembly 3 are disposed in the front area. For the purpose of maintenance, the hard disk assembly 2 is disposed closer to the host casing front panel. The hard disk assembly 2 and the fan assembly 3 are spaced by a certain gap to create a space for the airflow from caused by the fan assembly 3. The hard disk assembly 2 and the fan assembly 3 both are standard components whose heights are 2U, their quantities may be adjusted according to requirements, this embodiment employs five pairs of the hard disk assemblies 2 and fan assemblies 3 so as to occupy almost the heightwise and widthwise spaces of the front area of the host casing. Removing one or more pairs of the hard disk assemblies 2 and fan assemblies 3 can facilitate the ventilation of the host casing. In the case that five pairs are employed, the ventilation still meets the requirement due to the aforementioned gaps.

Further, there is a hard disk back panel 7 disposed on an inner side of the host casing in which the hard disk assembly 2 is tightly attached. Two ends of the hard disk back panel 7 are connected and fixed to two sidewalls of the 2U host casing, and the hard disk back panel 7 has a plurality of hard disk ports in array for the insertion of the hard disk in the hard disk assembly 2, which not only provides the connection of electrical signal but also provides a certain degree of mechanical fixing force.

The fan assembly 3 is configured for the heat dissipation of the heat generating component, such as the GPU and CPU in the rear area. For providing support to the top and bottom areas divided from the rear area, there is a lateral beam 11 further disposed at an air outlet of the fan assembly 3. The lateral beam 11 is disposed at the 1U height of the host casing, and its two ends are fixed to the two sidewalls of the host casing. Further, there are a plurality of screw holes or engagement holes on the lateral beam 11 for the connection and fixation to other components.

Further, a top cover 10 is disposed on the front area and the rear area.

As shown in FIG. 1 and FIG. 2, the rear area is further divided into a top area and a bottom area; four GPUs 1 arranged in alternate arrangement shown in FIG. 6 and the GPU tray 4 are disposed in the rear area. In specific, as shown in FIG. 1, a third GPU 1c and a first GPU 1a are set into a pair, and their notches 011 are tightly matching each other so that the third GPU 1c and the first GPU 1a are arranged in an alternate arrangement; a second GPU 1b and a fourth GPU 1d are set into a pair, and their notches 011 are also tightly matching each other so that the second GPU 1b and the fourth GPU 1d are arranged in an alternate arrangement; the longitudinal sides of the first GPU 1a and the second GPU 1b are tightly attached to each other so that they are arranged in a way of "back against back". The body of the GPU tray 4 is in a plate shape and is disposed in a rectangular area surrounded by the four GPUs 1 to provide support to the four GPUs. One end of the GPU tray 4 is fixed to the lateral beam 11 via one or more screws, and the other end is fixed to the bottom plate of the host casing via a pillar. The front supports 013 of the third GPU 1c and the fourth GPU 1d can be fixed in position via the cooperation of the engagement structure and the engagement hole. The rear supports 014 of the third GPU 1c and the fourth GPU 1d may not be fixed in position because the installation of the front support 013 is enough to fix the GPUs in position. If it requires to enhance the fixation, a pillar may be employed on the bottom plate of the host casing and fixed and connected to the GPU tray 4 via a screw. Correspondingly, the front supports 013 of the first GPU 1a and the second GPU 1b are fixed to the rear panel of the host casing and the rear support 014 can be fixed on the GPU tray 4.

The GPU tray 4 is kept at a position of half-height of the host casing, which substantially splits the airflow generated from the fan assembly 3. The airflow may be evenly split into two parts respectively flowing toward the upper GPUs and lower CPUs, achieving a heat dissipation efficiency superior to other designs.

In addition, there are power modules 13 respectively disposed in spaces formed between the first GPU 1a, the second GPU 1b, and the left and right sidewalls of the host casing to supply power to the four GPUs nearby.

In order to monitor the working temperature of the host casing, a temperature sensor is provided between the hard disk assembly 2 and the hard disk back panel 7 for measuring the temperature of the airflow drawn into the fan assembly 3; and there is an alarm monitor device 12 disposed on a side of the GPU 1 for measuring in-time temperature of the host casing. Considering the temperature of the drawn airflow and the in-time temperature, the working temperature of the host casing can be determined. When the temperature is too high, the alarm monitor device 12 will output an alarm to remind the security guard to step in immediately.

Figure 3:
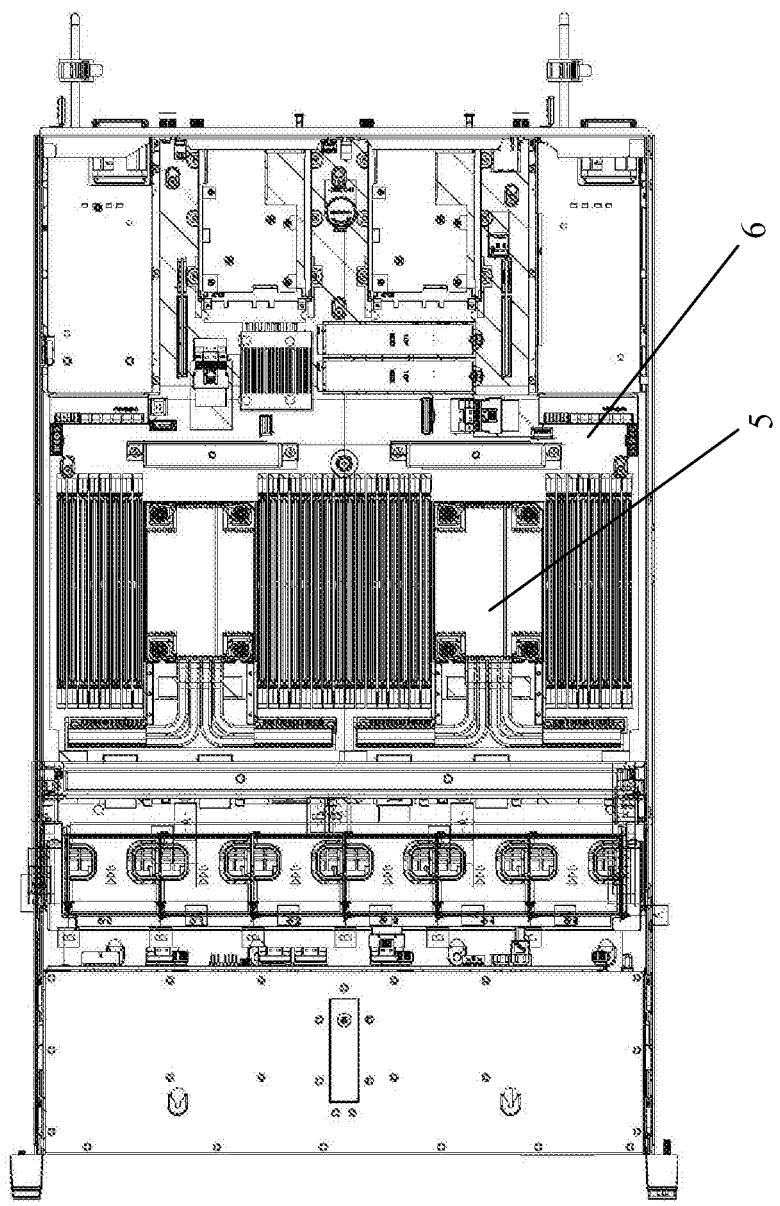
FIG. 3 is a top view of the bottom area of one embodiment of the invention, while the top area of a GPU and the GPU tray are removed.

As shown in FIG. 2 and FIG. 3, where FIG. 3 is a top view of the lower area when the GPU tray 4 and the GPU 1 in the top area are removed. As shown, there are a plurality of connectors and two CPUs 5 disposed on the bottom plate 6. These connectors provide a communication channel between the upper GPUs and the lower CPUs.

Figure 4:
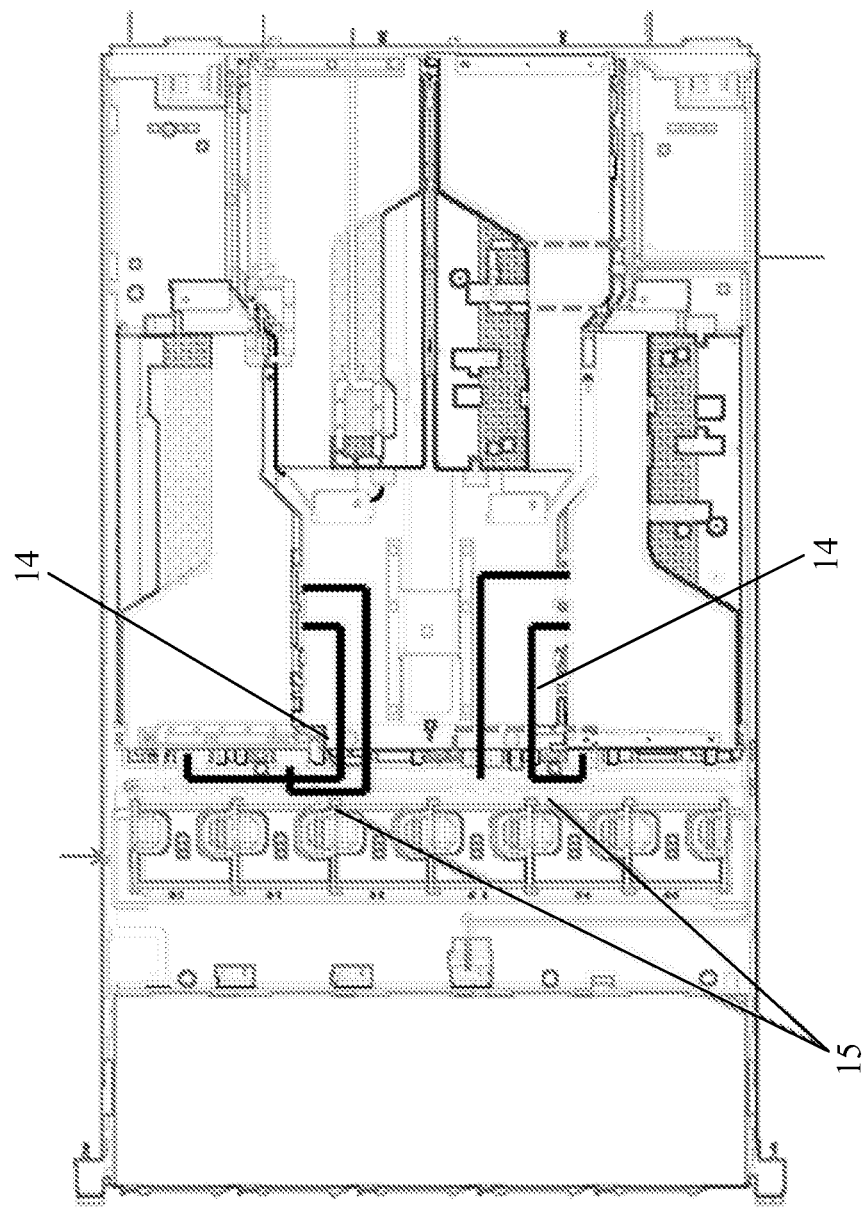
FIG. 4 shows an arrangement of four GPUs of one embodiment of the invention.
Figure 5:
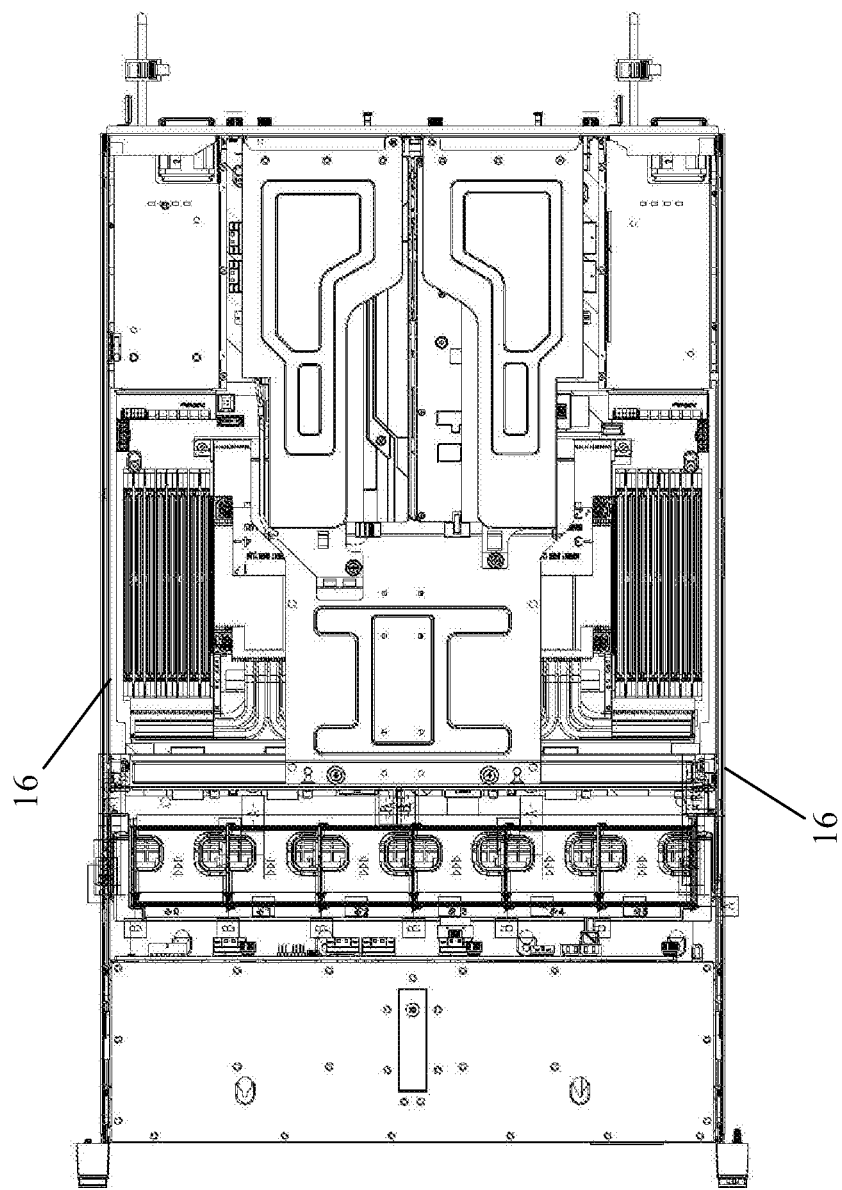
FIG. 5 shows an arrangement of two GPUs of one embodiment of the invention.

FIG. 4 and FIG. 5 are schematic diagrams respectively showing four GPUs and two GPUs. FIG. 4 specifically shows the wiring condition of the third GPU 1c and the fourth GPU 1d. As shown in FIG. 4, connection cables 14 are shown in black thick lines, one end thereof is connected to connector on the protrusion 012 of the GPU, and one end thereof is connected to the GPU connector 15 of the motherboard. In specific, the connection cables 14 transfer power and signals. As clearly shown in FIG. 5, the power module 13 also provides power to the hard disk assembly 2 via power cable 16.

The aforementioned GPUs and host casing hardware configuration improve the appearance of GPU, such that two of the GPUs being arranged in an alternate arrangement will have a smaller overall width, a new hardware configuration in the host casing may be designed based on such appearance. In this way, accommodating 4 GPUs into one host casing is achieved, which improves the space utilization of the interior of the host casing (i.e., maximizing the space utilization of the inner space of the host casing). Also, although there are more components being accommodated in the host casing, the disclosure employs sensor and alarming devices to monitor working temperature to reduce the possibility of break down due to high temperature.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A host casing hardware configuration, wherein a 2U host casing is divided into a front area and a rear area, a hard disk assembly and a fan assembly are disposed in the front area; the rear area is further divided into a top area and a bottom area; four graphic processing units (GPUs) and a GPU tray are disposed on the top area and are arranged in an alternate arrangement, a motherboard and a CPU and a motherboard connector disposed on the motherboard are disposed in the bottom area;

cavity portion formed by the at least one circumferential inner edge;

wherein in each of the four GPUs, the GPU has components and wiring being integrated on an outer casing, wherein a body of the outer casing comprises a rectangle having a notch, and the notch is located at a corner of the rectangle and is in a trapezoid shape with a right angle, a rear support is disposed on an end of the outer casing having the notch, a front support is disposed on another end of the outer casing; the rear support has a through hole, and an engagement component is disposed on the front support, a protrusion mating the notch is located on a longitudinal side of the outer casing; and a plurality of GPU connectors are disposed on a side surface of the protrusion and are configured to introduce signal;

wherein the four GPUs are arranged in the alternate arrangement by tightly matching the notches of the four GPUs.

2. The host casing hardware configuration according to claim 1, wherein a hard disk back panel is disposed on a side of the hard disk assembly near the fan assembly, two ends of the hard disk back panel are fixed and connected to two side walls of the 2U host casing to provide signal connection to the hard disk assembly.

3. The host casing hardware configuration according to claim 2, wherein a temperature sensor is disposed between the hard disk assembly and the hard disk back panel for sensing a temperature of an air inlet of the fan assembly.

4. The host casing hardware configuration according to claim 1, wherein a lateral beam is disposed at an air outlet side of the fan assembly, two ends of the lateral beam are fixed and connected to two side walls of the 2U and have a plurality of engagement holes and a plurality of screw holes thereon.

5. The host casing hardware configuration according to claim 4, wherein an end of the GPU tray is fixed to a middle part of the lateral beam; the front supports of a third GPU and a fourth GPU of the four GPUs are respectively fixed to two ends of the lateral beam.

6. The host casing hardware configuration according to claim 5, wherein the rear supports of a first GPU and a second GPU of the four GPUs are fixed to another end of the GPU tray.

\* \* \* \* \*